(12) United States Patent
Sheafor et al.

(10) Patent No.: US 9,880,583 B2
(45) Date of Patent: Jan. 30, 2018

(54) LOW POWER AUTONOMOUS PERIPHERAL MANAGEMENT

(71) Applicant: Ambiq Micro, Inc, Austin, TX (US)

(72) Inventors: Stephen James Sheafor, Boulder, CO (US); Scott Hanson, Austin, TX (US); Donovan Popps, Austin, TX (US)

(73) Assignee: Ambiq Micro, Inc., Austin, TX (US)

( * ) Notice: Subject to any disclaimer, the term of this patent is extended or adjusted under 35 U.S.C. 154(b) by 179 days.

(21) Appl. No.: 14/918,397

(22) Filed: Oct. 20, 2015

(65) Prior Publication Data

US 2016/0110299 A1 Apr. 21, 2016

Related U.S. Application Data

(60) Provisional application No. 62/066,218, filed on Oct. 20, 2014.

(51) Int. Cl.
| | |
|---|---|
| *G06F 1/06* | (2006.01) |
| *G06F 1/12* | (2006.01) |
| *G06F 11/30* | (2006.01) |
| *G06F 11/34* | (2006.01) |
| *G06F 13/10* | (2006.01) |
| *G01R 19/00* | (2006.01) |
| *G05F 1/56* | (2006.01) |
| *H03K 17/687* | (2006.01) |
| *H03M 1/12* | (2006.01) |
| *H03L 7/00* | (2006.01) |
| *G06F 1/32* | (2006.01) |

(52) U.S. Cl.
CPC ........... *G06F 1/06* (2013.01); *G01R 19/0084* (2013.01); *G05F 1/56* (2013.01); *G06F 1/12* (2013.01); *G06F 1/3237* (2013.01); *G06F 1/3287* (2013.01); *G06F 11/3041* (2013.01); *G06F 11/3414* (2013.01); *G06F 13/102* (2013.01); *H03K 17/687* (2013.01); *H03L 7/00* (2013.01); *H03M 1/12* (2013.01); *Y02B 60/1221* (2013.01); *Y02B 60/1228* (2013.01); *Y02B 60/1282* (2013.01)

(58) Field of Classification Search
CPC ................................. G06F 1/3287; G06F 1/06
See application file for complete search history.

(56) References Cited

U.S. PATENT DOCUMENTS

| | | | | |
|---|---|---|---|---|
| 6,412,075 | B1 * | 6/2002 | Klein | G06F 1/32 713/322 |
| 2002/0004811 | A1 * | 1/2002 | Bauhofer | G06F 9/52 718/107 |
| 2005/0198405 | A1 * | 9/2005 | Newman | G06F 13/105 710/1 |
| 2015/0006965 | A1 * | 1/2015 | Hanssen | G06F 11/3636 714/38.13 |

\* cited by examiner

*Primary Examiner* — Farley Abad
(74) *Attorney, Agent, or Firm* — Hunt Pennington Kumar & Dula, PLLC; Artie Pennington; Jeffrey Van Myers (57) ABSTRACT

A low power autonomous peripheral operative to receive configuration or command data and to perform the designated operation(s) without interaction of a processor.

2 Claims, 6 Drawing Sheets

| 31 ... 27 | 26 ... 24 | 23 ... 20 | 19 ... 16 | 15 ... 0 |
|---|---|---|---|---|
| Reserved | SLOTNUM 106 | Reserved | FIFOCNT 108 | FIFODATA 104 |

| Position | Name | R/W | Default | Description |
|---|---|---|---|---|
| 15:0 | DATA | RW | 0x0 | The oldest entry in the FIFO. The FIFO pointer is incremented by writing any value to this register if FIFOCNT > 0 |
| 19:16 | FIFOCNT | R | 0x0 | The number of valid entries in the FIFO |
| 26:24 | SLOTNUM | R | 0x0 | The slot number associated with the FIFO data |

LOW POWER AUTONOMOUS PERIPHERAL MANAGEMENT

CROSS REFERENCE TO RELATED APPLICATIONS

This application is related to the following:
1. Provisional Application Ser. No. 62/066,218, filed 20 Oct. 2014 ("Parent Provisional");
2. PCT Application No. PCT/US15/50239 filed 15 Sep. 2015 ("Related Application 1");
3. U.S. application Ser. No. 14/855,105, filed 15 Sep. 2015 ("Related Application 2");
4. U.S. application Ser. No. 14/918,384, filed simultaneously herewith ("Related Application 3");
5. U.S. application Ser. No. 14/918,437, filed simultaneously herewith ("Related Application 4"); and
6. U.S. application Ser. No. 14/918,406, filed simultaneously herewith ("Related Application 5").

This application claims priority to the Parent Provisional, and hereby claims benefit of the filing date thereof pursuant to 37 CFR § 1.78(a)(4).

The subject matter of the Parent Provisional and the Related Application, each in its entirety, is expressly incorporated herein by reference.

BACKGROUND OF THE INVENTION

1. Field of the Invention

The present invention relates to low power autonomous peripheral circuits and methods. The novel low power autonomous peripheral circuits and methods are suitable for use in low power microprocessors, microcontrollers, or power management devices.

2. Description of the Related Art

In general, in the descriptions that follow, the first occurrence of each special term of art that should be familiar to those skilled in the art of integrated circuits ("ICs") and systems will be italicized. In addition, when a term that may be new or that may be used in a context that may be new, that term will be set forth in bold and at least one appropriate definition for that term will be provided. In addition, throughout this description, the terms assert and negate may be used when referring to the rendering of a signal, signal flag, status bit, or similar apparatus into its logically true or logically false state, respectively, and the term toggle to indicate the logical inversion of a signal from one logical state to the other. Alternatively, the mutually exclusive boolean states may be referred to as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Hereinafter, reference to a facility shall mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities of each system. Depending on the intended system application, the several facilities comprising the hardware platform may be integrated onto a single IC, or distributed across multiple ICs. Depending on cost and other known considerations, the electronic components, including the facility-instantiating IC(s), may be embodied in one or more single- or multi-chip packages. However, unless expressly stated to the contrary, the form of instantiation of any facility shall be considered as being purely a matter of design choice.

Figure 1:
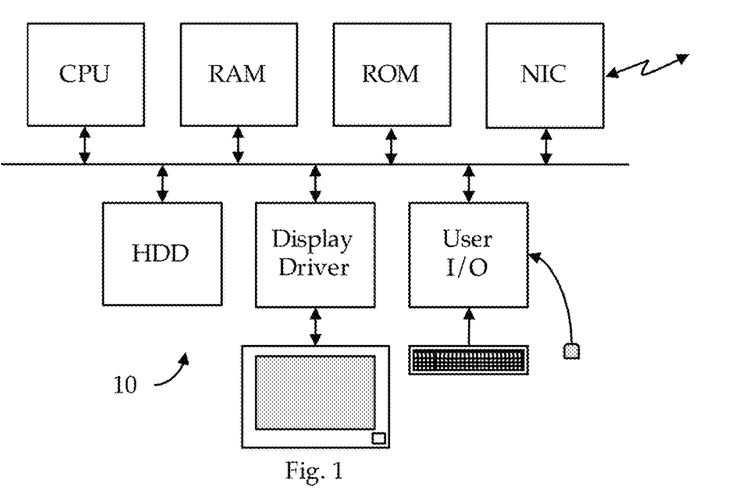
FIG. 1 illustrates, in block diagram form, a general purpose computer system adapted to instantiate any of the several embodiments.

Shown in FIG. 1 is a typical general purpose computer system 10. Although not all of the electronic components illustrated in FIG. 1 may be operable in the sub-threshold or near-threshold domains in any particular embodiment, some, at least, may be advantageously adapted to do so, with concomitant reductions in system power dissipation. In particular, in recently-developed battery-powered mobile systems, such as smart-phones and the like, many of the discrete components typical of desktop or laptop devices illustrated in FIG. 1 are integrated into a single integrated circuit chip. In the Related Application, I have disclosed circuits adapted to operate in the sub-threshold domain.

Figure 2:
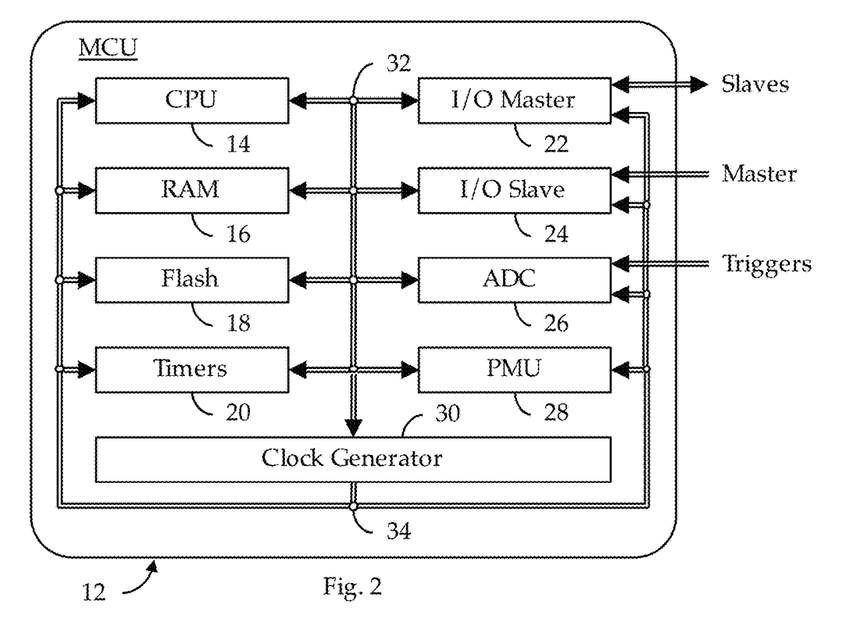
FIG. 2 illustrates, in block diagram form, a typical integrated system adapted to practice any of the several embodiments.

Shown by way of example in FIG. 2 is a typical single-chip microcontroller unit ("MCU") 12 comprising: a central processing unit ("CPU") 14; at least one random-access memory ("RAM") facility 16; at least one Flash memory ("Flash") facility 18; one or more timers ("Timers") 20; at least one input/output master ("I/O Master") facility 22; at least one input/output slave ("I/O Slave") facility 24; at least one analog to digital converter ("ADC") facility 26; a power management unit ("PMU") 28; and a clock generator ("Clock Generator") facility 30. A system bus ("System Bus") 32 interconnects the several MCU facilities 14-30, and a clock distribution bus ("Clock Bus") 34 distributes all clock signals developed by the Clock Generator 30 to the respective clocked facilities. As is known, development of the several clocks is generally controlled by information written to one or more control registers within Clock Generator 30 via the System Bus 32, and by system power state information typically provided by the PMU 28.

Figure 3:
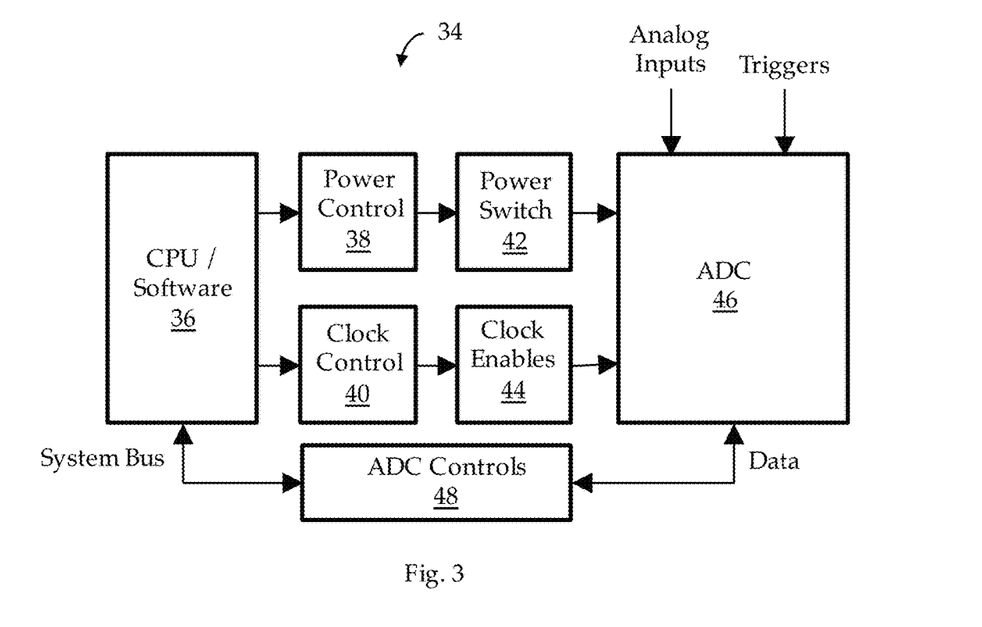
FIG. 3 illustrates, in block diagram form, a traditional circuit and method for processing data from an ADC conversion.

Traditional low power System On Chip ("SOC") implementations supporting various peripherals such as analog signal-to-digital-conversion ("ADC"), Inter-Integrated Circuit ("I2C") input/output ("I/O") interfaces, or Serial Peripheral Interface ("SPI") I/O interfaces utilize various methods for reducing the overall system power consumption. These approaches include a combination of software and hardware mechanisms for disabling the power hungry digital and analog circuitry and also control gating the clocking circuitry when the peripherals are not being used by the system. As an example, FIG. 3 illustrates, in block diagram form, one traditional circuit facility 34 for processing the data from an ADC conversion. As is illustrated, CPU/software 36 provides inputs for power control 38 and clock control 40. Power control 38 and power switch 42 provide power to ADC 46 as a function of inputs from CPU/software 36. The power provided to ADC 46 power may be gated on and off as a function of the inputs provided by CPU/software 36. Clock control 38 and clock enables 44 provide various clocks to ADC 46 as a function of inputs provided by CPU/software 36. The various clock provided by clock enables 44 may vary as a function of the inputs provided by CPU/software 36. ADC Controls 48 receives data from ADC 46 and interfaces with the CPU for the transfer of data to and from CPU/Software 36. As is known to one of ordinary skill in the art of computer peripheral design, CPU/software 36 may include software for analyzing, averaging or comparing the data. These traditional approaches incur a certain amount of overhead for managing power switches, clock enables, data collection, and similar operations, requiring the central processing unit ("CPU") to remain active, thus consuming additional power.

What is needed is a method and apparatus adapted to support autonomous peripheral operations while consuming less power than known prior art.

BRIEF SUMMARY OF THE INVENTION

In one embodiment, an autonomous peripheral facility comprising: a central processing unit (CPU) adapted to develop a first input; a peripheral device adapted to receive a first data input, develop a first data output, and develop a first information data; and a peripheral controller comprising a configuration register, a state machine, a control unit, and a memory, said peripheral controller being adapted to receive said first input, to exchange said first information data, and to autonomously operate said peripheral device, independent of said CPU after receiving said first input; wherein: said configuration register is further adapted to receive said first input and develop a first control data as a function of said first input; said peripheral device is further adapted to exchange said first information data with a selected one of said control unit and said memory; said state machine is further adapted to: selectively receive a trigger; selectively sequence a plurality of peripheral modes as a function of said first control data and said trigger; selectively develop a first completion signal as a function of said first control data; and selectively develop a first power switch signal as a function of said first control data; said control unit is further adapted to: exchange said first information data with said peripheral device, said memory, and said state machine; selectively sequence a plurality of peripheral power states as a function of said first control data and said trigger; and selectively develop a plurality of clocks as a function of said first control data and said trigger; and said memory adapted to store said first information data.

BRIEF DESCRIPTION OF THE SEVERAL VIEWS OF THE DRAWINGS

The several embodiments may be more fully understood by a description of certain preferred embodiments in conjunction with the attached drawings in which.

In the drawings, similar elements will be similarly numbered whenever possible. However, this practice is simply for convenience of reference and to avoid unnecessary proliferation of numbers, and is not intended to imply or suggest that identity is required in either function or structure in the several embodiments.

DETAILED DESCRIPTION

Figure 4:
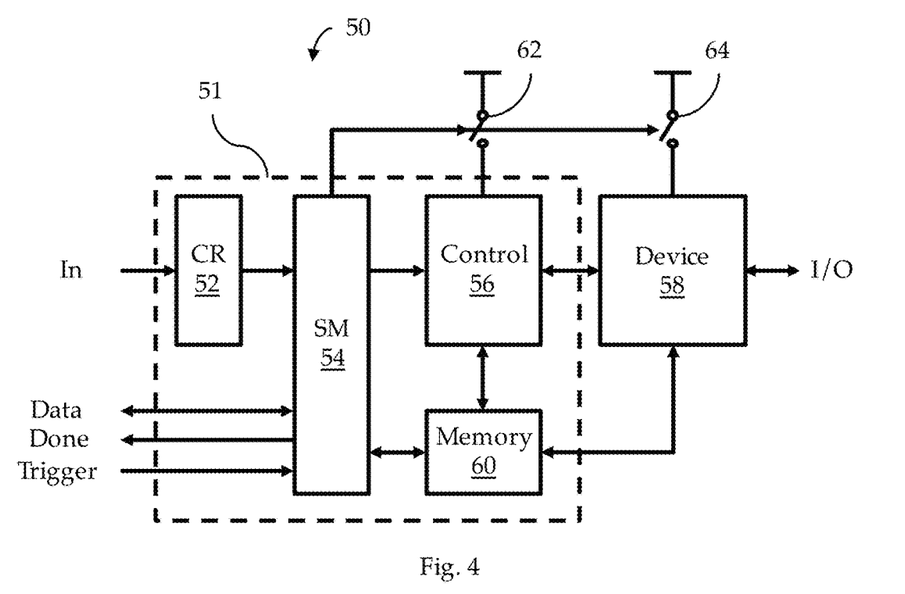
FIG. 4 illustrates, in block diagram form, a low power autonomous peripheral according to some embodiments.

FIG. 4 illustrates generally, in block diagram form, an autonomous peripheral facility 50 according to some embodiments. One objective of the illustrated embodiment is to eliminate CPU and software overhead for managing the power switches, clock enables, data collection and computations such that the system, including the CPU and other peripheral circuits, may be selectively powered down while a selective amount of data is managed by the low power autonomous peripheral facility 50. Autonomous peripheral facility 50 includes a device 58 and a peripheral controller 51. Peripheral controller 51 includes configuration register ("CR") 52, state machine ("SM") 54, control 56, and memory 60. CR 52 is coupled to SM 54 and is adapted to receive inputs from within the system, i.e., inputs from a CPU. SM 54 is coupled to control 56, memory 60, and power switches 62 and 64, and is adapted to receive configuration data stored in CR 52, to receive trigger or interrupt information, to develop completion data indicating the operation is done, provide data to and from memory 60, and provide control information to control 56, memory 60, and power switches 62 and 64. Device 58 is adapted to perform a specific function such as an analog to digital conversion, motion detection, or temperature measurement. Device 58 is adapted to receive data inputs, perform the function specific to device 58, and provide resultant data to control 56 and/or memory 60. Device 58 is adapted to receive data outputs from control 56 and/or memory 60, and provide resultant data on its outputs. This exchange of information between control 56, memory 60, and device 58 is well understood by one of ordinary skill in the art of integrated circuit design. Device 58 may reside on the same integrated circuit as the autonomous peripheral facility, or may reside in a separate component connected to control 56 via a communication mechanism, i.e., a SPI or I2C bus. Power switch 64 may reside on the same integrated circuit as the autonomous peripheral facility even in the case where device 58 is in an external component.

Figure 5:
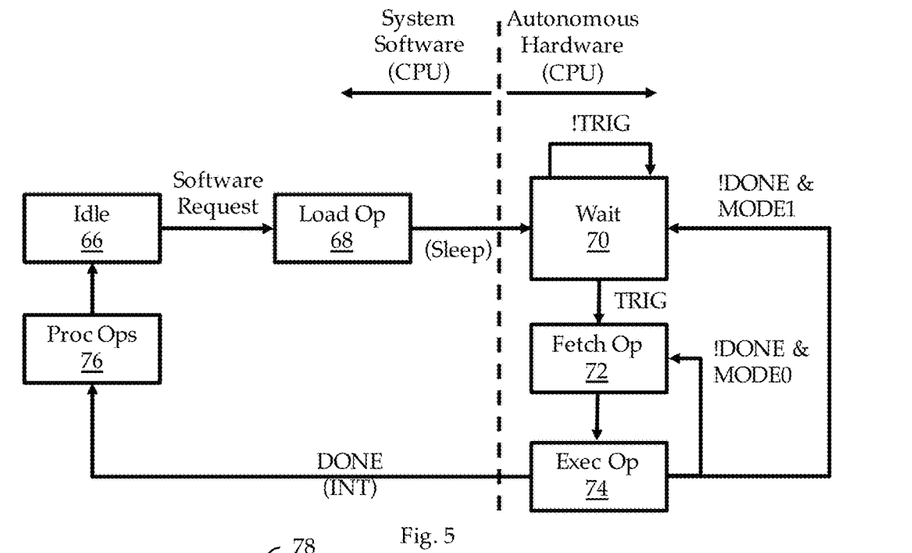
FIG. 5 illustrates a flow chart describing the general operation of autonomous peripheral facility 50.

FIG. 5 illustrates a flow chart describing the general operation of autonomous peripheral facility 50. According to one embodiment, the system software operating on the CPU exits idle state 66 and issues a software request, initiating a configuration or load operation 68. Referring back to FIG. 4, data is loaded into CR 52 via one or more writes via a system bus. This configuration data established the operational parameters of the autonomous peripheral 50. This data may include a variety of configuration information, command information, and/or actual data from some source within the system. As is known, this loading of data is sometimes referred to as "loading the operation". The source of the data within the system may be the CPU of the system, the system memory, or may be other controllers within the system. Configuration data stored in CR 52 may include a single command, a series of commands, single or multiple commands indicative of a sequence of operations, command data controlling power gating of various functions within autonomous peripheral facility 50, data to be stored, or other analogous command and data information.

Referring back to FIG. 5, after the load operation 68, i.e., the configuration data is loaded into the CR 52, the autonomous peripheral 50 is free to perform the peripheral operation as indicated by the configuration or command data stored in the CR 52. The input source within the system is free to be placed in a low power state, or put to sleep, thus reducing overall system power. According to one embodiment, SM 54 waits in an wait state 70 until a trigger or interrupt is received, indicating the start of an operation previously loaded into CR 52. Alternatively, SM 54 may treat the completion of loading CR 52 as trigger and immediately begin the operation. Upon receiving the trigger, SM 54 will enter the Fetch Operation state 72 and retrieve the first operation to execute. SM 54 then enters the Execute Operation state 74 and steps through a series of actions which may include: powering up control 56; powering up device 58; stepping through a set of pre-configured operations; and, upon completion of the specified operations, powering down device 58 and control 56, and optionally signaling that the operation is complete. The pre-configured operations may include sampling and storing data, transmitting any data from memory 60; or storing any received data into memory 60.

Upon completion of the operation, SM 54 checks for the presence of a DONE condition. If DONE is indicated, the autonomous peripheral process is complete, and according to one embodiment an interrupt INT is generated. INT causes the system to exit the sleep state and enter the Process Operation state 76. This may include retrieving any data placed by the low power autonomous peripheral facility 50 in memory 60 and performing a series of processing steps using that data. Upon completion of the Process Operation state 76, the system returns to idle state 66 and waits for subsequent operations.

If the DONE condition is not indicated, the low power autonomous peripheral facility 50 will execute additional operations without requiring the system to exit the sleep state. The behavior of SM 54 may be selected by a mode condition which is a function of the operation performed and the information in CR 52. According to one embodiment, a first mode, MODE0, indicates that SM 54 should return to the Fetch Operation state 72 and initiate another operation, allowing several operations to be performed based on a single trigger. A second mode, MODE1, indicates that SM 54 should return to the wait state 70, and a subsequent trigger will cause another set of operations to be performed. Thus it can be seen that the low power autonomous peripheral facility 50 can support significant system operations to be executed without requiring the system to exit the sleep state, thus reducing power. By controlling power switches 62 and 64 the power of many elements of the entire system the autonomous peripheral facility can further reduce system power.

Figure 6:
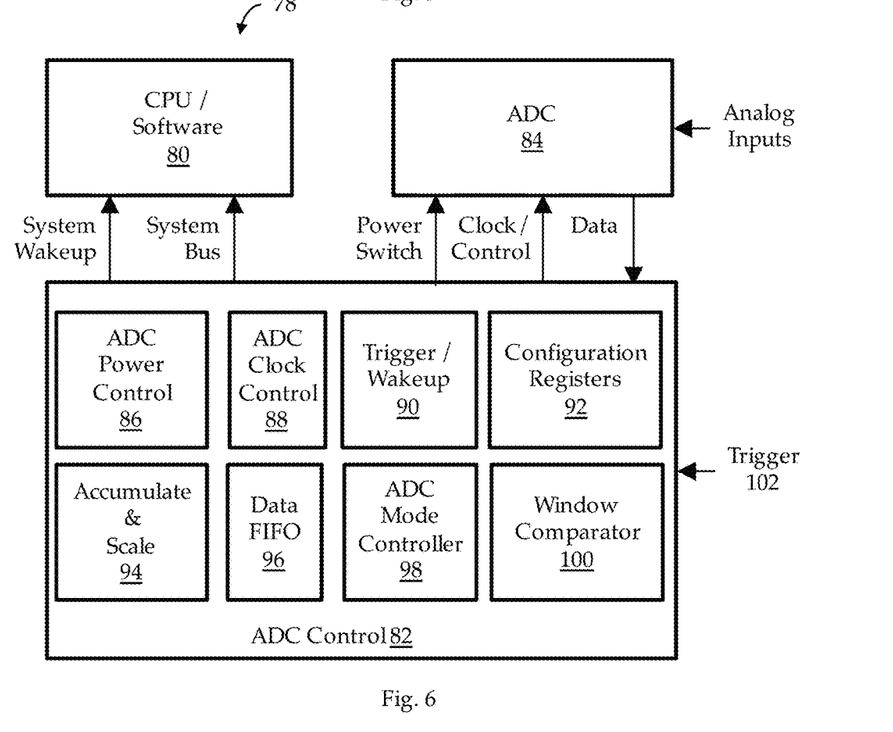
FIG. 6 illustrates, in block diagram form, an autonomous ADC facility.

FIG. 6 illustrates, in block diagram form, a low power autonomous ADC facility 78, according to a different embodiment. ADC facility includes CPU 80, ADC control 82, and ADC 84. ADC control 82 include ADC power control 86, ADC clock control 88, trigger/wakeup 90, configuration registers 92, accumulate and scale 94, data FIFO 96, ADC mode controller 98, and window comparator 100. As discussed previously, the illustrated embodiment minimizes CPU and software overhead. This CPU and software overhead may include tasks for managing the power switches, clock enables, data collection, averaging and data threshold comparisons. The elimination of the CPU and software overhead provides the opportunity to power down, or place into sleep mode, the system, which includes the CPU and all other peripheral circuitry, while a task or set of tasks are executed by the ADC facility 78. These tasks performed by ADC facility 78 may include periodically collecting and averaging a configured number of data samples, or detecting that an averaged data value has crossed a configured threshold. This autonomous execution of tasks by ADC facility 78 allows for the reduction of the total energy consumed by the system because the energy supporting the ADC functionality is limited to energy consumed in the ADC circuitry itself and its supporting control logic during one of the periodic sample data conversion events. This has the effect of reducing the power in the system effectively to state retained leakage power and the trigger wake-up circuitry during the time elapsing between data sample conversion events.

This architecture of the ADC facility 78 enables data collection and averaging to occur autonomously without requiring CPU 80 interaction for multiple independent data measurement slots. The data collected comes from ADC 84, which in one embodiment would be a multi-channel Successive Approximation Register (SAR) ADC, although many other types of ADC may be used in this application. Key features of this particular embodiment include multiple user-selectable analog data channels including external pins, internal voltages, and an internal temperature sensor, and multiple user-selectable on-chip and off-chip reference voltages. The data for each measurement is a single digital value corresponding to the analog voltage on the selected channel.

Each independent data measurement slot processes a configurable number of samples on one of the analog data channels before storing the processed data in a data queue, i.e., data FIFO 96. Upon completion of the data sample collection and averaging, the resultant data is stored in the software accessible data FIFO 96 along with an associated measurement slot number. If so configured, the CPU may be simultaneously awakened from a deep sleep state upon completion of the averaging function. With the slot number, valid entry queue count, and associated measurement data stored in the data queue, software may be simplified such that it does not need to maintain the remaining sample counts per channel or perform and filtering or averaging while the data is being collected thereby further reducing overall energy consumption.

The ADC controller 82 may wake up the CPU 80 from a powered off state upon the occurrence of an event requiring the interaction of the CPU 80, As an example, in the event that a data slot average has exceeded a programmed upper limit threshold or fallen below a lower limit threshold, ADC controller 82 may wake up the CPU 80 to address the issue accordingly.

The ADC control 82 logic utilizes an asynchronous structure in the trigger/wakeup 90 detect circuitry for enabling power switches and clocks. With this, all SOC clocks and switchable SOC power domains can be optionally, if so configured, and automatically disabled and powered off, thus limiting power consumption to the asynchronous trigger/wakeup 90 edge detect circuit and power control 86 circuitry.

According to this embodiment, the CPU 80 configures the ADC Control block 82 via one or more writes to the Configuration Registers 92 over the System Bus. The CPU 80 is then available to be placed in sleep mode. A trigger 102, selected by the Configuration Registers, signals to the ADC Power Control 86 and ADC Clock Control 88 blocks that a measurement should start. The ADC Power Control 86 block powers up the ADC 84 and the ADC Clock Control 88 block starts up the desired clock source. The ADC 84 can then step through its pre-configured scan sequence and dumps data into the accumulator 94 and FIFO 96. Once a scan sequence is complete, the ADC Power Control 86 can power down the ADC 84 and the ADC Clock Control 88 and release its request for a clock source. At a pre-configured time, the ADC Control block 82 can wake up the CPU 80 and initiate a transfer of the collected data to the CPU 80 and its associated memory.

Figure 7:
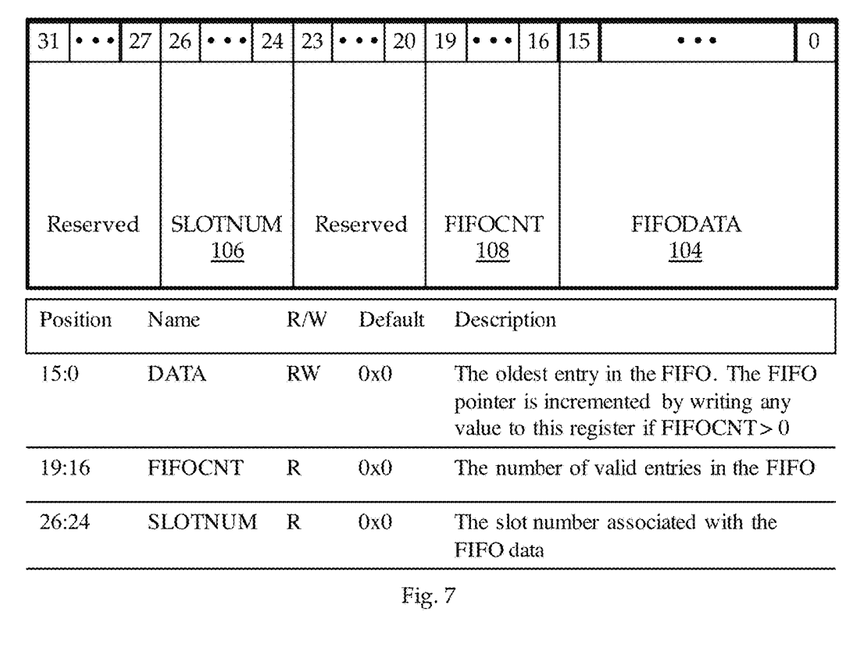
FIG. 7 illustrates, in table form, the architecture of the FIFO embodied in ADC Control 82.

FIG. 7 illustrates, in table form, the architecture of each element of the FIFO 96 embodied in ADC Control 82. The architecture of the ADC FIFO 96 is designed to minimize software overhead in accessing values from the FIFO 96. The architectural design of the ADC FIFO 96 is also simplifies the distribution of samples contained in the FIFO 96, those samples having been received from each slot, to the target software task that will process that stream of samples.

According to one embodiment, reading the FIFO 96, i.e., a load instruction, supplies the value of a sample, here labeled FIFODATA 104, as well as the slot number 106 that sourced the sample stored in FIFODATA 104. As one of ordinary skill in this art of computer architecture and software design would understand, with these two pieces of information, an interrupt service routine can target the correct buffer or the correct operating system message to distribute the sample from multiple streams. This allows samples from different slots to come back out of order, as they are prone to do when different averaging modes are used in different slots. Finally, the FIFO 96 contains a bit field containing the count, here labeled FIFOCNT 108, of valid samples currently in the FIFO 96. Thus, using this embodiment, a single load instruction returns all of this information, and load instruction from peripheral devices can be significantly longer than loads from local SRAM or caches. If the FIFOCNT 108 bit field is greater than zero, then the interrupt service routine or base level function knows immediately the sample data stored in FIFODATA 104 it just read is valid and usable. In addition, if the FIFOCNT 108 is greater than one (1), then firmware can make a decision whether to read it all now, or wait for a subsequent high water mark interrupt.

Trigger/Wakeup

Referring back to FIG. 6, according to one embodiment, the trigger/wakeup block 90 monitors the asynchronous trigger 102 when the ADC 84 is enabled through software. Trigger 102 may be initiated through software, internal timers or though external sources. When the ADC 84 is enabled, and one or more slots are enabled for accumulating sample data, the trigger/wakeup block 90 will asynchronously capture this event. This event capture signals the ADC power control 86 and the ADC clock control 88 to turn on, and signals to the ADC mode controller 98 to initiate a scan. Multiple triggers may be supported to initiate different operations.

ADC Power Control

The ADC power control 86 interacts with the trigger/wakeup block 90 and the ADC Mode controller 98 for optimally sequencing the power states of the ADC 84. When the ADC 84 has been configured to sample data, the ADC power control 86 will wait until a trigger event occurs before the power switch is enabled, thus powering up the ADC 84. After the power switch is enabled, the ADC 84 will wait a configurable number of cycles appropriate for the ADC 84 analog circuitry to calibrate before initiating data samples. When the ADC 84 is programmed to operate in its lowest power mode, this logic will disable the power switch immediately upon completion of a scan across all enabled slots/channels without requiring any other peripheral to be powered or process power control functions.

ADC Clock Control

Similarly, The ADC clock control 88 interacts with the trigger/wakeup 90 and ADC Mode controller 98 for optimally conserving power by limiting clock switching autonomously. When the ADC 84 has been configured to sample data, the ADC clock control 88 will wait until a trigger event occurs before the clock is enabled for the ADC 84, ADC mode controller 98, accumulate and scale logic 94, and data FIFO 96. No other synchronous software or hardware control is necessary for enabling and disabling the clock sources. The ADC Clock Control 88 supports multiple configurable clock frequencies for optimizing the sample rate over energy consumption.

Accumulate and Scale

The accumulate and scale 94 interacts with the ADC 84, data FIFO 96 and configuration registers 92. The accumulate and scale 94 accumulates the summation of a programmable number of consecutive data samples per enabled slot and divides, i.e., shifts, the result by the total number of samples accumulated to generate the averaged value written into the ADC FIFO 96. According to one embodiment, the accumulate and scale 94 utilizes a single adder and shift function for minimized power and area, multiplexing the input sources per measurement slot.

ADC Mode Controller

According to one embodiment, the ADC mode controller 98 contains an ADC control state machine for sequencing the signals and states through an ADC scan. The clock to this state machine is only running while the ADC 84 is actively processing a scan across its enabled channels. In one embodiment the Mode Controller 98 supports single shot, repeating single shot, multiple channel scan, and repeating scan modes as selected by the Configuration Registers 92.

Window Comparator

When the window comparison function is enabled, the window comparator 100 signals an interrupt to the CPU 80 when an enabled slots averaged data crosses a programmable high or low threshold.

The configuration registers 92 contain the software accessible control for enabling the ADC 84, configuring ADC power modes, reference voltage selects, clock frequencies, accessing measurement data, enabling and setting window comparison thresholds and setting interrupt control.

Low Power Modes

The ADC 84 can be programmed to power down between scans to minimize power consumption using the LPMODE field in the ADC_CFG register. Low power mode 0 leaves the ADC powered on between scans for high frequency scan rates. Low power mode 1 places the ADC into a low power state between samples consuming 1 uA while powered down in this mode. The low power mode 1 wake up time is 50 us. Low power mode 2 completely disables the power source to the ADC between scans effectively consuming zero power while powered down in this mode. The low power mode 2 wake up time is 150 us. The ADC 84 will automatically wake itself up and process the scan measurements if it is powered down, enabled and a trigger event occurs.

Figure 8:
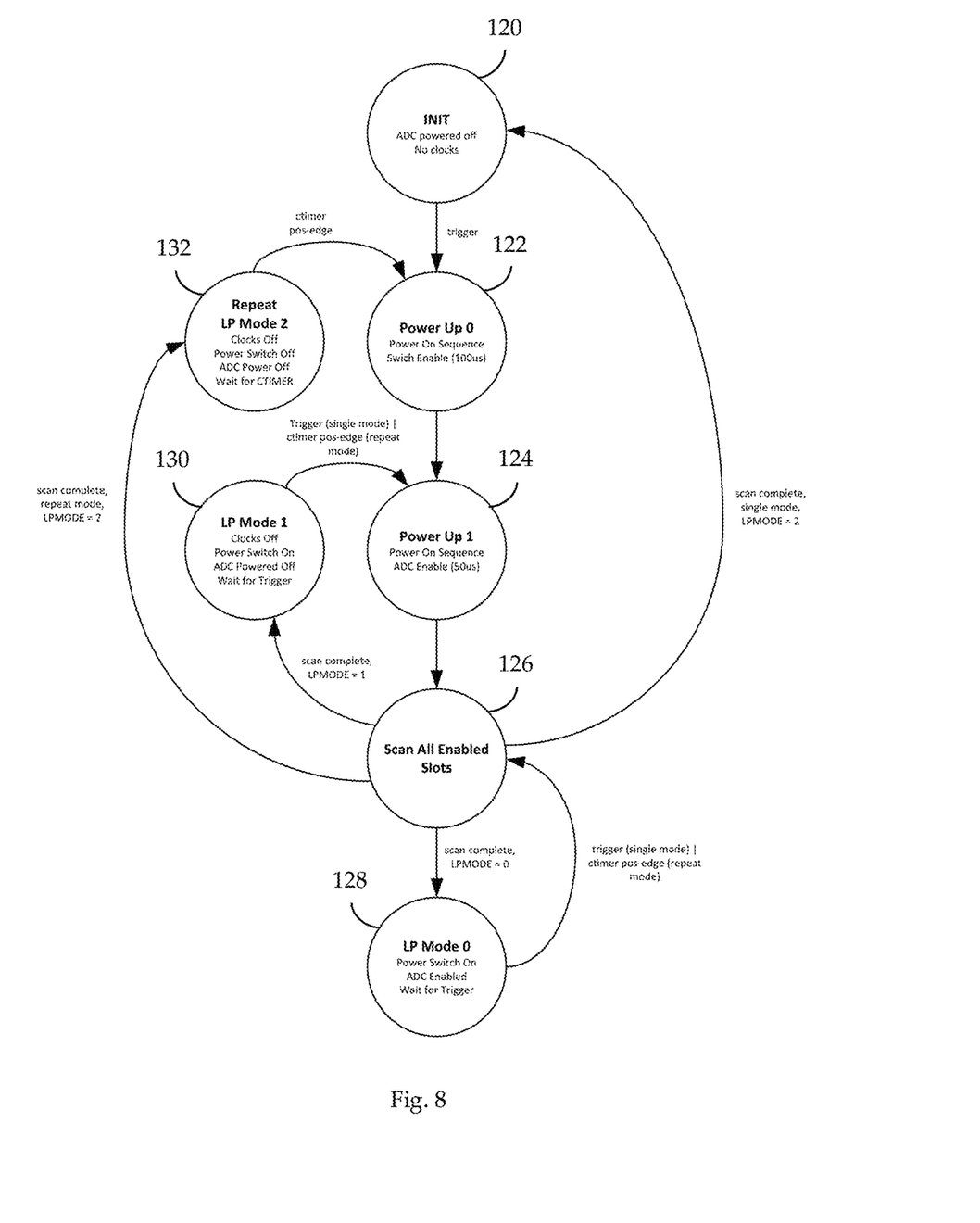
FIG. 8 illustrates, in flow chart form, the control flow for one embodiment of the autonomous peripheral hardware.

FIG. 8 illustrates, in flow chart form, the control flow for one embodiment of the autonomous peripheral hardware, which is a more detailed implementation of the basic concepts described for FIG. 5. The system is initially in the INIT 120 state, corresponding to the WAIT 70 state in FIG. 6. Once a trigger is received, the system moves to Power Up 0 state 122 where power is applied via ADC Power Control 86 to ADC 84, ADC Mode Controller 98 and any other necessary elements of ADC Control 82. The system then waits for a configured amount of time and then proceeds to Power Up 1 state 124, which functionally enabled ADC 84. This sequencing is important in minimizing the power required for the total operation.

In this embodiment a timer has been configured which can provide a periodic signal, the ctimer trigger. This signal is used by the system to execute multiple operations without requiring CPU 80 to exit the sleep state.

After an additional wait to insure that ADC 84 is in a stable state, the system proceeds to the Scan All Enabled Slots state 126. In this state the ADC Mode Controller 82 sequences through all slots which are enabled by Configuration Registers 92, selecting the required ADC input channel and retrieving the data from the ADC upon completion of the sample. Averaging and other more complex functions may be performed on this data, and a result is placed in Data FIFO 96 with an indication of the specific slot. An interrupt may be enabled in the Configuration Registers which will cause the CPU 80 to exit the sleep states and retrieve data from the Data FIFO 96.

When all slots have been sampled, an LPMODE field from the Configuration Registers 92 is checked to determine how the operation proceeds. In this example there are four possible modes:

LPMODE=0. In this case the system is sampling continuously without powering any components of the ADC down, so LP Mode 0 state 128 is entered. Once another ctimer trigger is received, the system goes directly to the Scan All Enabled Slots state 126 and repeats the scan. This process will continue until software modified the LPMODE field.

LPMODE=1. In this case the ADC 84 is disabled between scans, but the ADC Control 82 is left powered so that a new scan may be executed quickly because repeated scans are expected, so the system enters the LPMODE 1 state 130. Once another ctimer trigger is received, the system goes to the Power Up 1 state 124 and enables ADC 84, and after the configured wait goes to the Scan All Enabled Slots state 126 and repeats the scan. This process will continue until software modified the LPMODE field.

LPMODE=2, Repeat Mode selected. In this case both the ADC 84 and ADC Control 82 are powered down between scans, but repeated triggers are expected so the system enters the Repeat LP Mode 2 state 132. Once another ctimer trigger is received, the system goes to the Power Up 0 state 122 and repeats the power up sequence until it enters the Scan All Enabled Slots state 126 and repeats the scan. This process will continue until software modified the LPMODE field.

LPMODE=2, Single Mode selected. In this case only a single scan is configured to be executed in response to a trigger, so the system simply returns to the INIT state 120 and waits for a new trigger.

In Scan All Enabled Slots state 126 a single channel can be measured (i.e., single shot mode) by enabling one of the slots and disabling the other slots. Up to the total available number of channels can be measured sequentially in an arbitrary order (i.e., scan mode) by enabling two or more of the slots. Each measurement slot has individually selectable channel number, track/hold time, and accumulate and divide behavior.

Another embodiment of a low power autonomous peripheral is a module which is the Master of a serial I/O interface, i.e., I/O Master, such as I2C or SPI which are used to communicate with an external peripheral component. There are many cases where the system configures the I/O Master to perform one or more read and/or write transfer operations and enters a low power sleep state. At a subsequent point in time, based on a signal, i.e., the output of a timer, the I/O master executes one or more of the configured operations without requiring any interaction with the CPU. This allows the CPU to remain in the low power sleep state. Once all of the configured operations have been executed, the hardware interrupts the system and the processor will exit the sleep state and perform any necessary processing.

Referring back to FIG. 5, the I/O Master is normally in the IDLE state 66 when some event causes the I/O Master to go to the LOAD OP state 68 and load commands into the configuration register 52 of the I/O Master with one or more operations, and load a Write Data Buffer with any necessary write data. The I/O Master may be configured to immediately execute the operations by selecting mode DIRECT, but for Autonomous Operation the mode selected is AUTO and the CPU enters the sleep state and the hardware enters the WAIT state 70.

Once a request REQ is received, i.e., a trigger, the I/O Master goes to the FETCH OP state 72 and retrieves the first command. It then proceeds to the EXEC OP state 74 and performs either a write operation, i.e., transferring data from the Write Data Buffer out over the interface, or a read operation, i.e., transferring data from the interface to a Read Data Buffer. Other special operation types may also be executed. Once the operation is complete, the hardware checks to see if there are additional operations to be executed. If there are none, the DONE condition is satisfied and an INT is generated to wake the processor in state PROC OPS 76. In this state the processor will read any necessary data from the Read Data Buffer.

If there are more operations to be executed, the behavior is controlled by MODE information within the just completed command. In MODE0, the state machine proceeds to state FETCH OP 72 and immediately fetches and executes the next operation. In MODE1, the state machine returns to the WAIT state 70 and remains there until another REQ signal is detected. In this way a series of operations may be triggered by each REQ, and multiple copies of the series may be executed before the processor is interrupted and wakes from the sleep state. Additional modes may be supported.

As an example, assume that there is a sensor device connected as a slave on the I/O interface. Each interaction with this device requires a write of some configuration data, the write of an initiation bit and the read of some result data. This sequence is required to be executed every millisecond. The processor would execute the following sequence:

1. Load the configuration data to the Write Data Buffer.
2. Load the initiation byte information to the Write Data Buffer.
3. Write a write command to the configuration register of the length of the configuration data.
4. Write a write command to the configuration register of length 1.
5. Write a read command to the configuration register of length of the result data.
6. Repeat the above sequence 5 times.
7. Configure a timer to generate a REQ pulse every millisecond.
8. Go to sleep.

When the first REQ is generated, the autonomous hardware executes the two writes and one read, with the result being placed in the Read Data Buffer, and returns to the WAIT state 70. This sequence is repeated 5 times, once per millisecond. After the fifth read operation, the configuration register is empty, the DONE condition will be true and the hardware will generate an INT to wake the processor to retrieve the read data, i.e., to enter the Process Operations state 76.

The configuration register may also be designed to include more sophisticated commands. For example, there could be a looping function which allows command sequences to be executed multiple times, which reduces the required size of the configuration register at the cost of additional complexity. Another potentially useful command would be to wait for some specific time period. This could be useful if the sensor in the above example required a time delay between writing the initiation bit and retrieving the result.

The processor may wake up during the autonomous operation for other reasons, such as servicing a different peripheral interface. In that case additional commands could be added to the configuration register before the processor return to the sleep state which can further reduce the number of times the processor must be awakened.

In some cases the external peripheral which is connected to the I/O Master may be able to be powered down until it is accessed. In this case the internal power switch described below may be used to perform this power control function, under control of the serial I/O Master.

Integrated Power Switch to Control Off-Chip Components

Many low power systems contain a variety of chips arrayed around a microcontroller (MCU). The MCU often serves as the primary "brain" of the system and enables all other components to be placed in a low power state. However, the low power states of the other components are often unacceptably power hungry. It is therefore attractive to power down those other components using power switches. This invention relates to a power switching scheme that uses low resistance power switches integrated in the MCU chip to power gate off-chip components. Key to the invention are the control scheme, the custom I/O pad requirements, and the sneak leakage elimination scheme.

Figure 9:
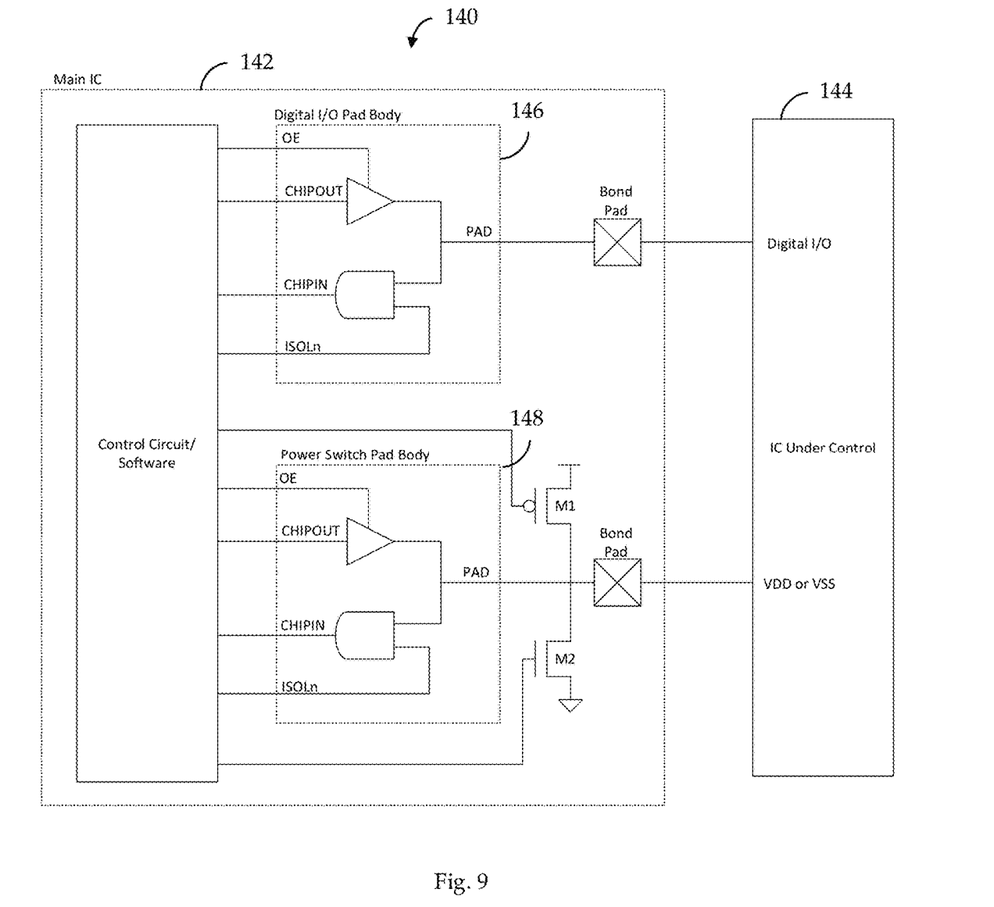
FIG. 9 illustrates, in partial block diagram form and partial schematic form, an exemplary embodiment of a power switching facility.

FIG. 9 illustrates, in partial block diagram form and partial schematic form, an exemplary power switching facility 140 according to one embodiment. The circuitry inside the chip labeled Main IC 142 supplies power or ground to an external IC labeled IC Under Control 144. One or more Digital I/O Pad 146 elements are used to make normal digital signal connections between the Main IC 142 and the IC Under Control 144. A Power Switch Pad 148 is used by the Main IC 142 to control the power to the IC Under Control 144, by switching either its power or ground connection. When power is gated to the IC Under Control 144, the state of all input/output pins becomes unknown. Consequently, any signals routed between the Main IC 142 and the IC Under Control 144 can float to values that cause significant short circuit current. The control scheme inside the Main IC 142 addresses this by tri-stating all signal pads (except for the gated power supply) connected to the IC Under Control 144 and disables all inputs from the IC Under Control 144. Such a power gating scheme allows extremely low leakage operation in a sleep mode without any short circuit currents.

In one embodiment the Power Switch Pad 148 may be implemented with the same circuitry as a Digital I/O Pad 146 and the addition of one or two low resistance high current switches M1 and/or M2. The Control Circuit in Main IC 142 can selectively enable these high current switch transistors if power switching is required, but disable them so that the Power Switch Pad may be used as a normal Digital I/O Pad.

Although described in the context of particular embodiments, one of ordinary skill in this art will readily realize that many modifications may be made in such embodiments to adapt either to specific implementations.

Thus it is apparent that an improved method and apparatus to control peripheral devices in a system while consuming less power than known prior art has been disclosed. Further, we submit that our method and apparatus provides performance generally superior to the best prior art techniques.

What is claim is:

1. An autonomous peripheral facility comprising:
 a central processing unit (CPU) adapted to develop a first input;
 a peripheral device adapted to receive a first data input, develop a first data output, and develop a first information data; and
 a peripheral controller comprising a configuration register, a state machine, a control unit, and a memory, said peripheral controller being adapted to receive said first input, to exchange said first information data, and to autonomously operate said peripheral device, independent of said CPU after receiving said first input;
 wherein:
  said configuration register is further adapted to receive said first input and develop a first control data as a function of said first input;
  said peripheral device is further adapted to exchange said first information data with a selected one of said control unit and said memory;
  said state machine is further adapted to:
   selectively receive a trigger;
   selectively sequence a plurality of peripheral modes as a function of said first control data and said trigger;
   selectively develop a first completion signal as a function of said first control data; and
   selectively develop a first power switch signal as a function of said first control data;
  said control unit is further adapted to:
   exchange said first information data with said peripheral device, said memory, and said state machine;
   selectively sequence a plurality of peripheral power states as a function of said first control data and said trigger; and
   selectively develop a plurality of clocks as a function of said first control data and said trigger; and
  said memory adapted to store said first information data.

2. The autonomous peripheral facility of claim 1 wherein said trigger is further characterized as being a function of said first control data.

* * * * *